US010446610B2

(12) United States Patent
Kim

(10) Patent No.: US 10,446,610 B2
(45) Date of Patent: Oct. 15, 2019

(54) ELECTRONIC DEVICE INCLUDING SEMICONDUCTOR MEMORY THAT INCLUDES A PLURALITY OF VERTICAL ELECTRODES SEPARATELY DISPOSED ON RESPECTIVE SIDEWALLS OF HOLE PATTERN

(71) Applicant: SK hynix Inc., Icheon (KR)

(72) Inventor: Kyung-Wan Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 471 days.

(21) Appl. No.: 14/958,665

(22) Filed: Dec. 3, 2015

(65) Prior Publication Data

US 2017/0005137 A1 Jan. 5, 2017

(30) Foreign Application Priority Data

Jul. 3, 2015 (KR) ........................ 10-2015-0095187

(51) Int. Cl.

| | |
|---|---|
| ***H01L 27/24*** | (2006.01) |
| ***G06F 3/06*** | (2006.01) |
| ***H01L 45/00*** | (2006.01) |
| ***H01L 27/22*** | (2006.01) |
| ***H01L 27/11514*** | (2017.01) |
| ***H01L 43/02*** | (2006.01) |
| ***H01L 43/08*** | (2006.01) |
| ***G06F 12/0846*** | (2016.01) |

(52) U.S. Cl.

CPC .......... *H01L 27/249* (2013.01); *G06F 3/0604* (2013.01); *G06F 3/0629* (2013.01); *G06F 3/0656* (2013.01); *G06F 3/0679* (2013.01); *G06F 12/0846* (2013.01); *H01L 27/11514* (2013.01); *H01L 27/222* (2013.01); *H01L 43/02* (2013.01); *H01L 43/08* (2013.01); *H01L 45/06* (2013.01); *H01L 45/08* (2013.01); *H01L 45/1226* (2013.01); *H01L 45/1253* (2013.01); *G06F 2212/1016* (2013.01); *G06F 2212/2024* (2013.01); *G06F 2212/222* (2013.01); *G06F 2212/225* (2013.01)

(58) Field of Classification Search

CPC . H01L 27/249; H01L 27/11514; H01L 27/222

See application file for complete search history.

(56) References Cited

U.S. PATENT DOCUMENTS 8,841,649 B2 9/2014 Pio
2013/0009122 A1* 1/2013 Park .................... H01L 27/2409 257/2

(Continued)

FOREIGN PATENT DOCUMENTS

KR 10-0993052 B1 11/2010

*Primary Examiner* — Minh Loan Tran

(57) ABSTRACT

An electronic device may include a semiconductor memory. The semiconductor memory may include a stack in which a plurality of dielectric layers and a plurality of first electrodes are alternately stacked over a substrate in a vertical direction relative to the substrate; a hole pattern passing through the stack in the vertical direction and having a polygonal shape when viewed in a plan view; a plurality of second electrodes disposed on respective sidewalls of the hole pattern; and a plurality of variable resistance layers interposed between the plurality of second electrodes and the plurality of horizontal electrodes.

18 Claims, 5 Drawing Sheets

M
15A
15 14 13
13
12
13
12
11

15 14 13
L1
L2
L3
L4

(56) References Cited

U.S. PATENT DOCUMENTS

2014/0077143 A1* 3/2014 Seong .................... H01L 45/12
257/2
2015/0380418 A1* 12/2015 Zhang .............. H01L 27/11529
257/326

* cited by examiner

ELECTRONIC DEVICE INCLUDING SEMICONDUCTOR MEMORY THAT INCLUDES A PLURALITY OF VERTICAL ELECTRODES SEPARATELY DISPOSED ON RESPECTIVE SIDEWALLS OF HOLE PATTERN

CROSS-REFERENCE TO RELATED APPLICATION

The present application claims priority of Korean Patent Application No. 10-2015-0095187, entitled "ELECTRONIC DEVICE" and filed on Jul. 3, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which characteristics of a variable resistance element are improved.

In an implementation, an electronic device may include a semiconductor memory. The semiconductor memory may include a stack in which a plurality of dielectric layers and a plurality of first electrodes are alternately stacked over a substrate in a vertical direction relative to the substrate; a hole pattern passing through the stack in the vertical direction and having a polygonal shape when viewed in a plan view; a plurality of second electrodes disposed on respective sidewalls of the hole pattern; and a plurality of variable resistance layers interposed between the plurality of second electrodes and the plurality of horizontal electrodes.

The second electrodes extend in the vertical direction and contact the substrate. The variable resistance layers include a transition metal oxide, a perovskite-based material, a phase change material, a chalcogenide-based material, a ferroelectric material, or a ferromagnetic material. The first electrodes and the second electrodes include any one transition metal or nitride selected from the group consisting of TiN, Pt, W, TaN, Ir, Ni, Cu, Ta, Ti, Hf, Zr, and a combination thereof. The length of the first electrode is shorter than the length of the dielectric layer so that grooves are formed between the first electrodes and the second electrodes, and the variable resistance layers are disposed in the grooves. The variable resistance layers are disposed along internal walls of the grooves. Each of the second electrode comprises a plurality of projections filling the remaining portions of grooves in which variable resistance layers are disposed, at each of the sidewalls of the hole pattern. Each of the dielectric layer and the first electrode has a closed loop shape when viewed in a plan view and surrounds the hole pattern and the second electrodes. The semiconductor memory comprises a plurality of cell arrays, each cell array being disposed along a corresponding one of the sidewalls of the hole pattern. The hole pattern is a quadrangular hole pattern having four sidewalls.

The electronic device may further comprise a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further comprise a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

The electronic device may further comprise a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further comprise a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

DETAILED DESCRIPTION

Figure 1:
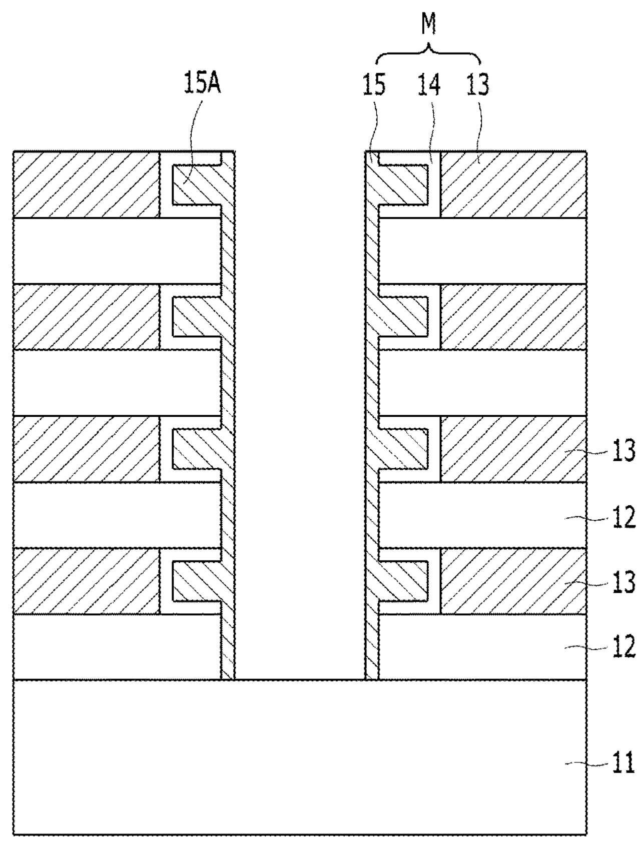
FIG. 1 is a cross-sectional view of a semiconductor device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
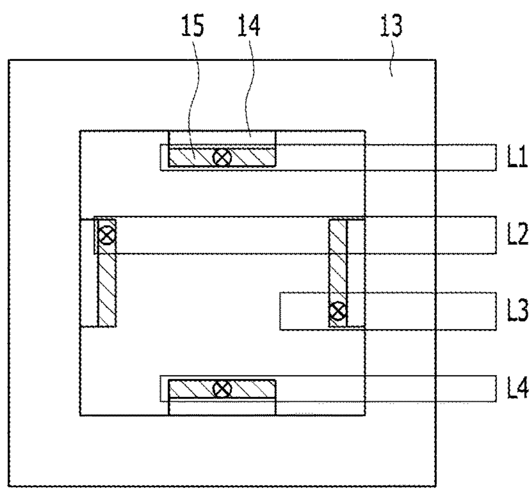
FIG. 2 is a plan view of the semiconductor device illustrated in FIG. 1.

FIG. 1 is a cross-sectional view of a semiconductor device in accordance with an implementation. FIG. 2 is a plan view of the semiconductor device illustrated in FIG. 1. In order to facilitate clear understanding of the present disclosure, the semiconductor device will be described below with reference to FIGS. 1 and 2.

As illustrated in FIG. 1, a stack in which dielectric layers 12 and horizontal electrodes 13 that are alternately stacked may be formed on a substrate 11. A hole pattern which passes through the stack and has a polygonal shape when viewed in a plan view may be formed. In this implementation, the hole pattern has four sidewalls and is referred to as a 'quadrangular hole pattern' hereinafter. A plurality of vertical electrodes 15 may be formed on respective sidewalls of the quadrangular hole pattern as illustrated in FIGS. 1 and 2.

In this implementation, the vertical electrode 15 may extend in a direction (hereinafter, referred to as 'vertical direction') perpendicular to a top surface of the substrate 11 and contact the substrate 11, and may be formed on each of the four sidewalls of the quadrangular hole pattern. Each of the horizontal electrode 13 and the dielectric layer 12 may have a closed loop shape when viewed in a plan view and surround the quadrangular hole pattern and the vertical electrodes 15. Memory devices M may be formed by interposing variable resistance layers 14 between the horizontal electrodes 13, which are vertically stacked on each sidewall of the quadrangular hole pattern, and a corresponding one of the vertical electrodes 15.

Each of the dielectric layers 12 disposed between two horizontal electrodes 13 vertically adjacent to each other insulates upper memory devices M disposed on the dielectric layer 12 from lower memory devices M disposed under the dielectric layer 12. The dielectric layers 12 may comprise of one or more types of dielectric materials including, for example, an oxide, a nitride, and so forth.

The horizontal electrode 13 applies a voltage or current to the variable resistance layers 14 coupled thereto. The horizontal electrode 13 may comprise of a conductive material. In an implementation, the conductive material may include any one transition metal or nitride selected from the group consisting of TiN, Pt, W, TaN, Ir, Ni, Cu, Ta, Ti, Hf, Zr, and a combination thereof.

Grooves (not shown) may be formed between the horizontal electrodes 13 and the vertical electrodes 15 by making the length of each horizontal electrode 13 shorter than the length of each dielectric layer 12. The grooves may be formed by selectively etching the horizontal electrodes 13 after forming the stack in which the dielectric layers 12 and the horizontal electrodes 13 are stacked and then forming the quadrangular hole pattern.

The vertical electrode 15 applies a voltage or current to the variable resistance layers 14 coupled thereto. The vertical electrode 15 may include a conductive material. The conductive material may include any one transition metal and nitride selected from the group consisting of TiN, Pt, W, TaN, Ir, Ni, Cu, Ta, Ti, Hf, Zr, and a combination thereof. In the present implementation, the vertical electrode 15 may include a plurality of projections 15A buried in grooves formed at each of four sides of the quadrangular hole pattern, respectively. In alternative implementations, however, the vertical electrodes 15 may not include the projections 15A buried in the grooves. Further, the size of the projections 15A and the presence/absence of the projections 15A may be adjusted depending upon the size of the grooves.

The variable resistance layers 14 may be interposed between the horizontal electrodes 13, which are stacked to be vertically isolated by the dielectric layers 12, and the vertical electrodes 15 on the respective sidewalls of the quadrangular hole pattern. In an implementation, the variable resistance layers 14 may be formed in the grooves after selectively etching the horizontal electrodes 13 to form the grooves and before forming the vertical electrodes 15, so that the variable resistance layers 14 may be coupled to and disposed between the horizontal electrodes 13 and the vertical electrodes 15.

The variable resistance layer 14 may include a material having a characteristic that allows the material to switch between different resistance states according to a voltage or current applied to both ends thereof. The variable resistance layer 14 may include any of various materials used in an RRAM, a PRAM, an FRAM and an MRAM, for example, a transition metal nitride, a transition metal oxide, a metal oxide such as a perovskite-based material, a phase change material such as a chalcogenide-based material, a ferroelectric material and a ferromagnetic material.

The variable resistance layer 14 may have a single-layered structure or a multi-layered structure in which two or more layers are combined to exhibit a variable resistance characteristic. The variable resistance layers 14 may be formed along internal walls of the grooves by forming a variable resistance film along a profile of the horizontal electrodes 13 and the dielectric layers 12 after the grooves are formed. In alternative implementations, however, the variable resistance layers 14 may not be formed on the internal walls of the grooves. Further, it is to be noted that the variable resistance layer 14 may be formed in any shape which connects both electrodes (e.g., a horizontal electrode 13 and a vertical electrode 15) with each other.

When the variable resistance layers 14 are formed along the internal walls of the grooves, the projections 15A of the vertical electrodes 15 may be formed by filling the remaining portions of the grooves after the variable resistance layers 14 are formed.

In this implementation, four cell arrays may be formed in one hole pattern by forming the quadrangular hole pattern and forming the four vertical electrodes 15 and the variable resistance layers 14 that are separated on the respective sidewalls of the quadrangular hole pattern. Due to this fact, advantages are provided in that the degree of integration of the semiconductor device may be increased to two times when compared to the case where vertical electrodes are formed in such a way as to completely fill a hole pattern. Also, in the present implementation, the hole pattern is formed as the quadrangular hole pattern which has 4 sides. In alternative implementations, however, more than four cell arrays may be formed by forming a hole pattern having more than 4 sides and forming a plurality of vertical electrodes and a plurality of variable resistance layers on sidewalls of the hole pattern. In an implementation, the number of cell arrays and the number of vertical electrodes correspond to the number of sides of the hole pattern.

While it is illustrated in FIGS. 1 and 2 that the horizontal electrode 13 is positioned uppermost, this is nothing but a mere example for facilitating clear understanding of the present disclosure. Thus, in another implementation, the dielectric layer 12 or interlayer dielectric layer may be positioned uppermost, and the vertical electrodes 15 may be partially exposed between portions of the “top” dielectric layer 12 or interlayer dielectric layer such that wiring lines may be at least partially formed on the vertical electrodes 15 to be in contact with the vertical electrodes 15.

The wiring lines of the respective cell arrays according to the quadrangular hole pattern may be arranged as L1, L2, L3 and L4 of FIG. 2.

The above and other semiconductor devices based on the disclosed technology can be used in a range of devices or systems. FIGS. 3-7 provide some examples of devices or systems that can implement the semiconductor devices disclosed herein.

Figure 3:
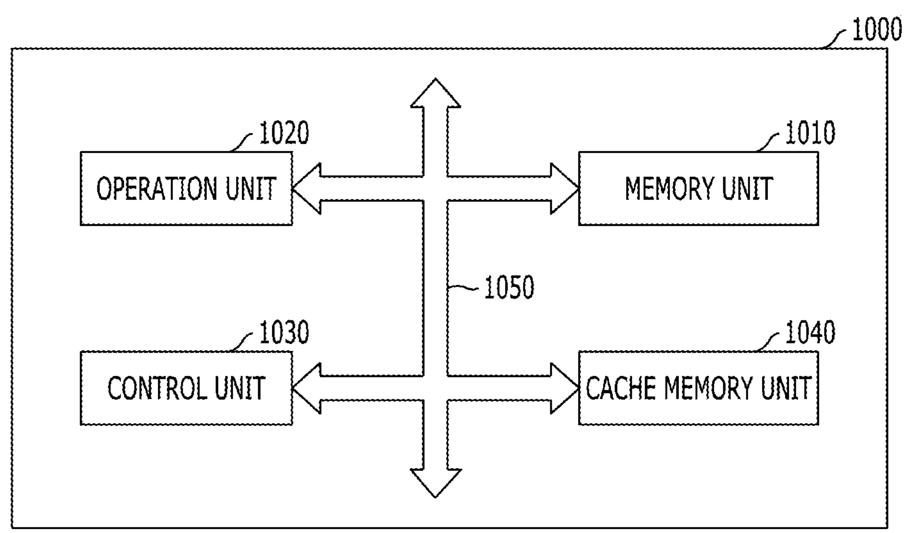
FIG. 3 is an example of a configuration diagram of a microprocessor implementing memory circuitry based on the disclosed technology.

FIG. 3 is an example of configuration diagram of a microprocessor implementing memory circuitry based on the disclosed technology.

Referring to FIG. 3, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a stack in which a plurality of dielectric layers and a plurality of first electrodes are alternately stacked over a substrate in a vertical direction relative to the substrate; a hole pattern passing through the stack in the vertical direction and having a polygonal shape when viewed in a plan view; a plurality of second electrodes disposed on respective sidewalls of the hole pattern; and a plurality of variable resistance layers interposed between the plurality of second electrodes and the plurality of horizontal electrodes. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 4:
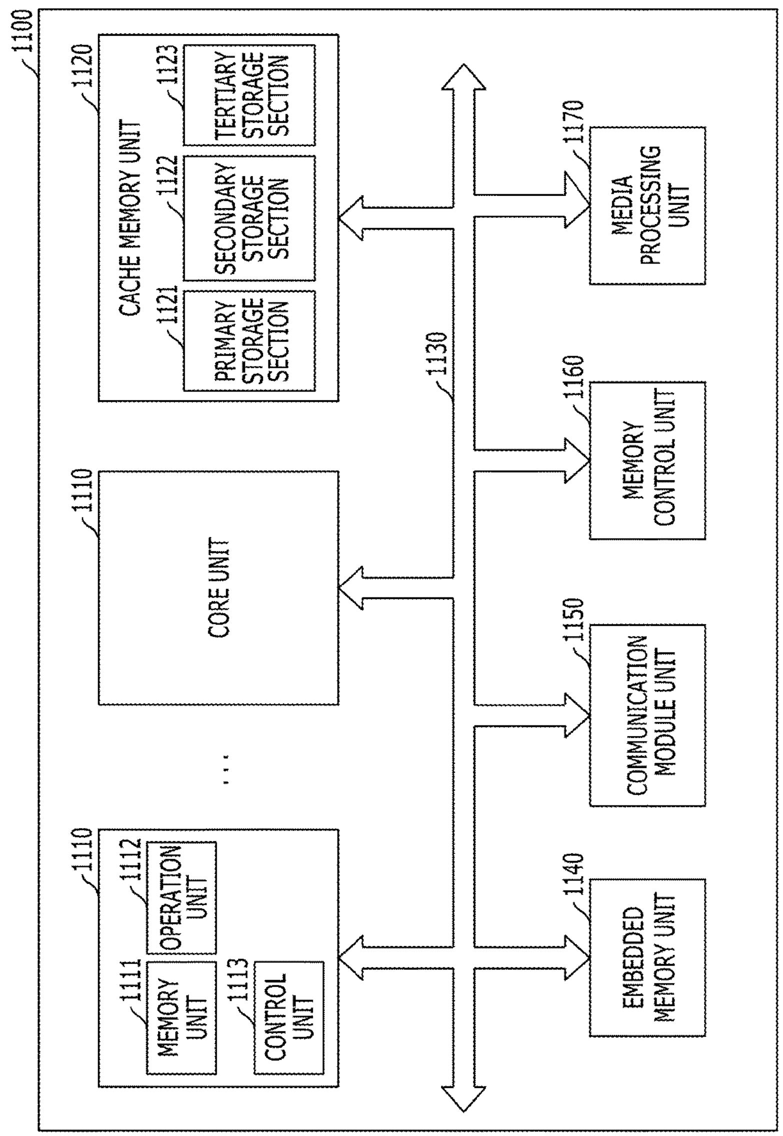
FIG. 4 is an example of a configuration diagram of a processor implementing memory circuitry based on the disclosed technology.

FIG. 4 is an example of configuration diagram of a processor implementing memory circuitry based on the disclosed technology.

Referring to FIG. 4, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a stack in which a plurality of dielectric layers and a plurality of first electrodes are alternately stacked over a substrate in a vertical direction relative to the substrate; a hole pattern passing through the stack in the vertical direction and having a polygonal shape when viewed in a plan view; a plurality of second electrodes disposed on respective sidewalls of the hole pattern; and a plurality of variable resistance layers interposed between the plurality of second electrodes and the plurality of horizontal electrodes. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 4 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 5:
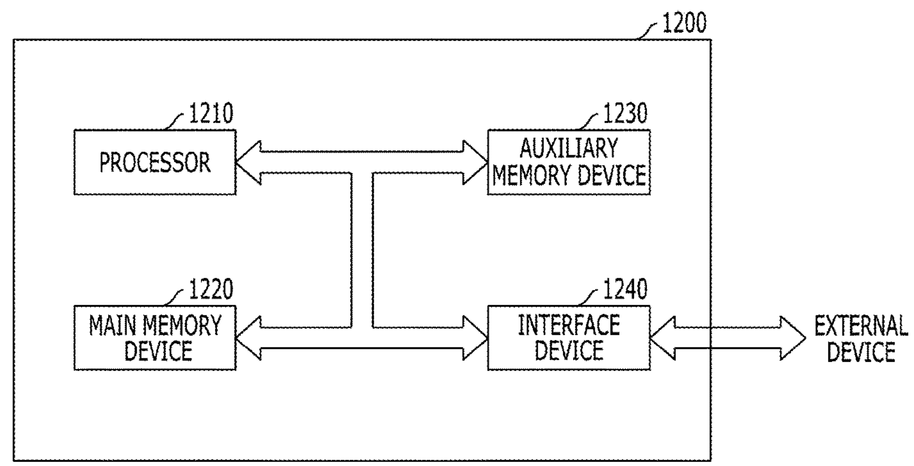
FIG. 5 is an example of a configuration diagram of a system implementing memory circuitry based on the disclosed technology.

FIG. 5 is an example of configuration diagram of a system implementing memory circuitry based on the disclosed technology.

Referring to FIG. 5, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a stack in which a plurality of dielectric layers and a plurality of first electrodes are alternately stacked over a substrate in a vertical direction relative to the substrate; a hole pattern passing through the stack in the vertical direction and having a polygonal shape when viewed in a plan view; a plurality of second electrodes disposed on respective sidewalls of the hole pattern; and a plurality of variable resistance layers interposed between the plurality of second electrodes and the plurality of horizontal electrodes. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a stack in which a plurality of dielectric layers and a plurality of first electrodes are alternately stacked over a substrate in a vertical direction relative to the substrate; a hole pattern passing through the stack in the vertical direction and having a polygonal shape when viewed in a plan view; a plurality of second electrodes disposed on respective sidewalls of the hole pattern; and a plurality of variable resistance layers interposed between the plurality of second electrodes and the plurality of horizontal electrodes. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 6:
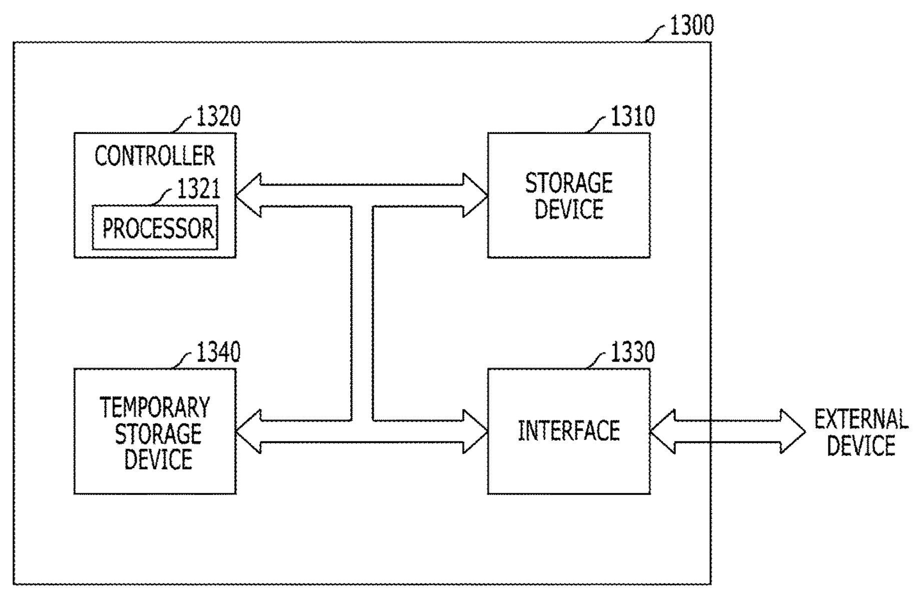
FIG. 6 is an example of a configuration diagram of a data storage system implementing memory circuitry based on the disclosed technology.

FIG. 6 is an example of configuration diagram of a data storage system implementing memory circuitry based on the disclosed technology.

Referring to FIG. 6, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a stack in which a plurality of dielectric layers and a plurality of first electrodes are alternately stacked over a substrate in a vertical direction relative to the substrate; a hole pattern passing through the stack in the vertical direction and having a polygonal shape when viewed in a plan view; a plurality of second electrodes disposed on respective sidewalls of the hole pattern; and a plurality of variable resistance layers interposed between the plurality of second electrodes and the plurality of horizontal electrodes. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 7:
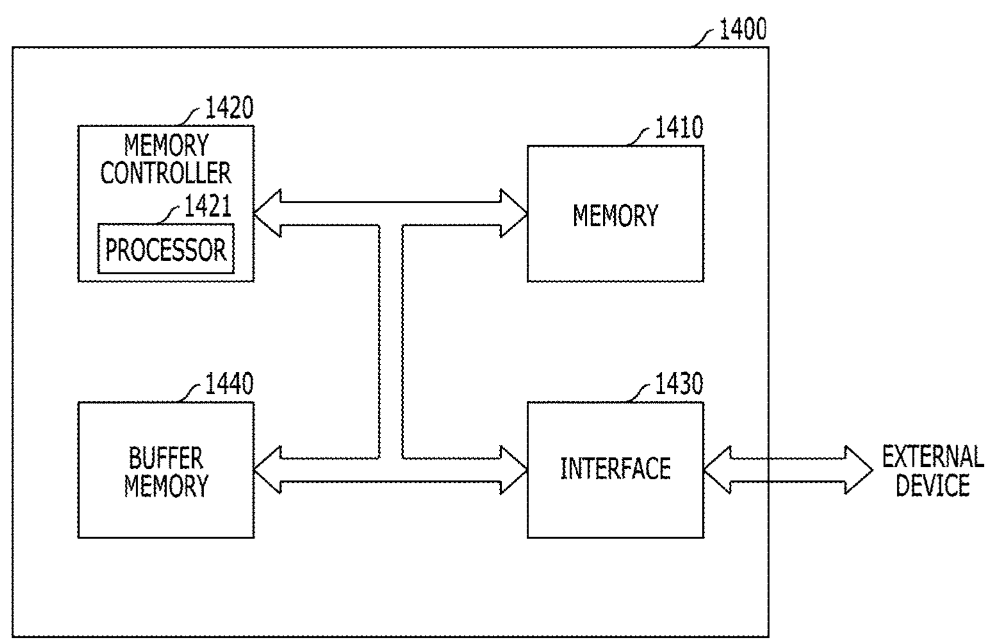
FIG. 7 is an example of a configuration diagram of a memory system implementing memory circuitry based on the disclosed technology.

FIG. 7 is an example of configuration diagram of a memory system implementing memory circuitry based on the disclosed technology.

Referring to FIG. 7, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a stack in which a plurality of dielectric layers and a plurality of first electrodes are alternately stacked over a substrate in a vertical direction relative to the substrate; a hole pattern passing through the stack in the vertical direction and having a polygonal shape when viewed in a plan view; a plurality of second electrodes disposed on respective sidewalls of the hole pattern; and a plurality of variable resistance layers interposed between the plurality of second electrodes and the plurality of horizontal electrodes. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a stack in which a plurality of dielectric layers and a plurality of first electrodes are alternately stacked over a substrate in a vertical direction relative to the substrate; a hole pattern passing through the stack in the vertical direction and having a polygonal shape when viewed in a plan view; a plurality of second electrodes disposed on respective sidewalls of the hole pattern; and a plurality of variable resistance layers interposed between the plurality of second electrodes and the plurality of horizontal electrodes. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 3-7 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, the semiconductor memory comprising:

a stack in which a plurality of dielectric layers and a plurality of first electrodes are alternately stacked over a substrate in a vertical direction relative to the substrate;

a hole pattern passing through the stack in the vertical direction and having a polygonal shape when viewed in a plan view;

a plurality of second electrodes disposed on respective inner sidewalls of the hole pattern, the plurality of second electrodes being separated from each other; and a plurality of variable resistance layers interposed between the plurality of second electrodes and the plurality of first electrodes.

2. The electronic device of claim 1, wherein the plurality of second electrodes extend in the vertical direction and contact the substrate.

3. The electronic device of claim 1, wherein the plurality of variable resistance layers include a transition metal oxide, a perovskite-based material, a phase change material, a chalcogenide-based material, a ferroelectric material, or a ferromagnetic material.

4. The electronic device of claim 1, wherein the plurality of first electrodes and the plurality of second electrodes include any one transition metal or nitride selected from the group consisting of TiN, Pt, W, TaN, Ir, Ni, Cu, Ta, Ti, Hf, Zr, and a combination thereof.

5. The electronic device of claim 1, wherein the length of each of the plurality of first electrodes is shorter than the length of each of the plurality of dielectric layers so that a plurality of grooves are formed between the plurality of first electrodes and the plurality of second electrodes, and the plurality of variable resistance layers are disposed in the plurality of grooves, respectively.

6. The electronic device of claim 5, wherein each of the plurality of variable resistance layers is disposed along an internal wall of each of the plurality of grooves.

7. The electronic device of claim 6, wherein each of the plurality of second electrodes comprises a plurality of projections, each projection filling each of the plurality of grooves in which each of the plurality of variable resistance layers has been disposed, at each of the sidewalls of the hole pattern.

8. The electronic device of claim 1, wherein each of the plurality of dielectric layers and the plurality of first electrodes has a closed loop shape when viewed in a plan view and surrounds the hole pattern and the plurality of second electrodes.

9. The electronic device of claim 1, wherein the semiconductor memory comprises a plurality of cell arrays, each of the plurality of cell arrays being disposed along a corresponding one of the sidewalls of the hole pattern.

10. The electronic device of claim 9, wherein the hole pattern is a quadrangular hole pattern having four sidewalls.

11. The electronic device according to claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

12. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

13. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

14. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

15. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

16. An electronic device including a semiconductor memory, the semiconductor memory comprising:

a stack in which a plurality of dielectric layers and a plurality of first electrodes are alternately stacked over a substrate in a vertical direction relative to the substrate;

a hole pattern passing through the stack in the vertical direction and having a polygonal shape when viewed in a plan view;

a plurality of second electrodes disposed on respective sidewalls of the hole pattern, the plurality of second electrodes being separated from each other; and a plurality of variable resistance layers interposed between the plurality of second electrodes and the plurality of first electrodes, wherein the length of each of the plurality of first electrodes is shorter than the length of each of the plurality of dielectric layers so that a plurality of grooves are formed between the plurality of first electrodes and the plurality of second electrodes, and the plurality of variable resistance layers are disposed in the plurality of grooves, respectively.

17. The electronic device of claim 16, wherein each of the plurality of variable resistance layers is disposed along an internal wall of each of the plurality of grooves.

18. The electronic device of claim 17, wherein each of the plurality of second electrodes comprises a plurality of projections, each projection filling each of the plurality of grooves in which each of the plurality of variable resistance layers has been disposed, at each of the sidewalls of the hole pattern.

* * * * *